United States Patent [19]

Quinlan et al.

[11] Patent Number: 4,488,914
[45] Date of Patent: Dec. 18, 1984

[54] PROCESS FOR THE EPITAXIAL DEPOSITION OF III-V COMPOUNDS UTILIZING A CONTINUOUS IN-SITU HYDROGEN CHLORIDE ETCH

[75] Inventors: Kenneth P. Quinlan, Newton; Thomas E. Erstfeld, Bedford, both of Mass.

[73] Assignee: The United States of America as represented by the Secretary of the Air Force, Washington, D.C.

[21] Appl. No.: 437,655

[22] Filed: Oct. 29, 1982

[51] Int. Cl.³ .................. H01L 21/205; H01L 21/322
[52] U.S. Cl. ................................ 148/175; 29/576 E; 149/174; 156/610; 156/612; 156/613; 156/614
[58] Field of Search ............... 148/174, 175; 156/610, 156/612-614; 29/576 E

[56] References Cited

U.S. PATENT DOCUMENTS

| | | | |
|---|---|---|---|
| 3,218,205 | 11/1965 | Ruehrwein | 148/175 |
| 3,441,000 | 4/1969 | Burd et al. | 148/175 X |
| 3,471,324 | 10/1969 | Wilson et al. | 148/175 X |
| 3,511,723 | 5/1970 | Burd | 148/175 |
| 3,673,011 | 6/1972 | Strull | 148/175 |
| 3,806,381 | 4/1974 | Asao | 148/175 |
| 3,839,082 | 10/1974 | Kasano et al. | 117/201 |
| 4,001,056 | 1/1977 | Groves et al. | 148/175 |
| 4,007,074 | 2/1977 | Ogirima et al. | 148/175 |
| 4,116,733 | 9/1978 | Owen et al. | 156/613 X |
| 4,147,571 | 4/1979 | Stringfellow et al. | 148/175 |
| 4,155,784 | 5/1979 | Mills et al. | 148/175 |
| 4,220,488 | 9/1980 | Duchemin et al. | 148/175 |

OTHER PUBLICATIONS

Olsen et al., "Crystal Growth . . . (Im, Ga) (Aa, P) . . . Hydride . . . Epitaxy . . . ", Prog. Crystal Growth Charact., vol. II, 1979, pp. 309-375.

Pogge et al., "Doping Behavior of Sillcon . . . III-V Epitaxial Films", J. Crystal Growth, 31, (1975), pp. 183-189.

Kennedy et al., "Effect of the Hydrogen Carrier Gas . . . . Hydride System", J. Crystal Growth, 24/25, (1974), pp. 233-238.

DiLorenzo, J. V., "Vapor Growth of Epitaxial GaAa . . . . Epitaxial Layers", J. Crystal Growth, 17, (1972), pp. 189-206.

Shaw, D. W., "Epitaxial GaAa Kinetic Studies: (001) Orientation", J. Electrochem. Soc., vol. 117, No. 5, May 1970, pp. 683-687.

Hoyt et al., "Preparation of Epitaxial . . . Gallium Arsenide by Iron Doping", J. Electrochem. Soc., vol. 113, No. 3, Mar. 1966, pp. 296-297.

Enstrom et al., "Influence of Gas-Phase . . . GaAa P-N Junctions", J. Electrochem. Soc., vol. 121, No. 11, Nov. 1974, pp. 1516-1523.

*Primary Examiner*—William G. Saba
*Attorney, Agent, or Firm*—Donald J. Singer; William J. O'Brien

[57] ABSTRACT

A process for depositing an epitaxial film of a III-V compound onto the surface of a crystallographically compatible substrate which includes contacting said substrate with a vaporous mixture of a group III element and a group V element to effect the deposition of a group III-V compound thereon while simultaneously introducing a flow of hydrogen halide gas during deposition of the group III-V compound.

5 Claims, 1 Drawing Figure

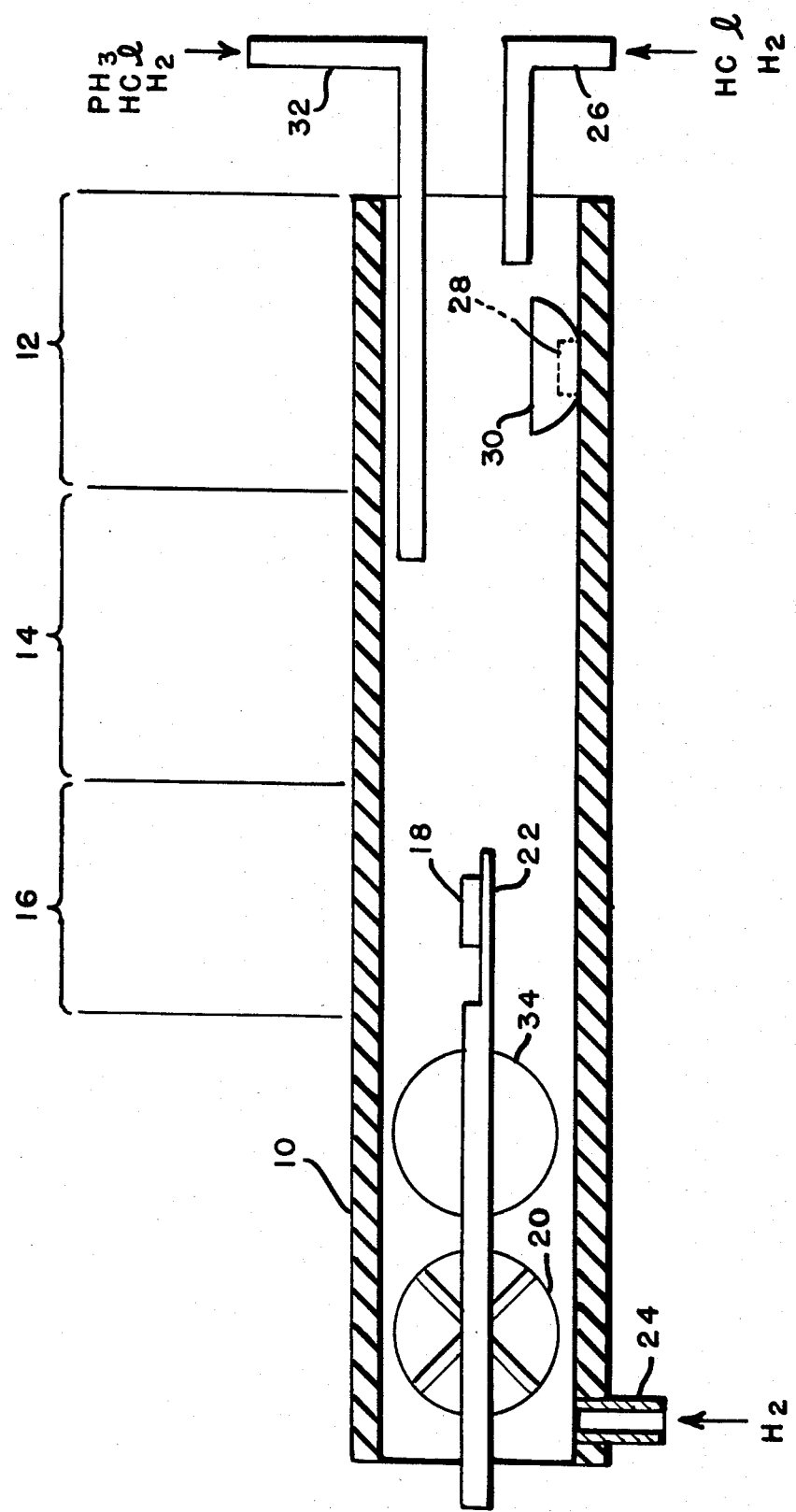

PROCESS FOR THE EPITAXIAL DEPOSITION OF III-V COMPOUNDS UTILIZING A CONTINUOUS IN-SITU HYDROGEN CHLORIDE ETCH

STATEMENT OF GOVERNMENT INTEREST

The invention described herein may be manufactured and used by or for the Government for governmental purposes without the payment of any royalty thereon.

BACKGROUND OF THE INVENTION

The present invention relates, in general, to a process for depositing III-V semiconductor compounds as epitaxial films onto semiconductor substrates which are crystallographically compatible with said films. In a more particular aspect, this invention relates to a process for effecting a continuous, insitu, hydrogen chloride etch during the vapor phase epitaxial deposition of III-V mixed compounds onto semiconductor substrates. The resulting epitaxial structures find particular utility in the fabrication of double heterostructure lasers, light-emitting diodes and field effect transistors. III-V semiconductor compounds, as is well understood by those skilled in semiconductor technology, are those which include elements from group III and group V of the Periodic Table of Elements. The components can be binary, ternary or quaternary mixtures of any of those elements.

The recent interest in the development of epitaxial structures for use in a variety of semiconductor applications has spawned a considerable research effort in an attempt to grow high quality epitaxial films on semiconductor substrates. Heretofore, it has been extremely difficult to obtain epitaxial layers of III-V compounds that exhibit good morphology and possess relatively few impurities.

The need for high quality epitaxial structures is most important in that area of optical communications technology which forms an integral part of present day tactical weapons systems. Lasers and photodetectors are two of the essential components in optical communication systems and the III-V epitaxial film coated substrates are the basic structures used in the fabrication of these components. The use of high quality III-V epitaxial structures of good morphology with defect-free surfaces dramatically improves the efficiencies and life time of the lasers and photodetectors, thus providing a much more efficient and reliable tactical communications system.

The III-V epitaxial structures used for semiconductor applications, such as those employed in the fabrication of light-emitting diodes, photo-detectors and double-heterostructure lasers, generally include the arsenides, antimonides, phosphides and nitrides of aluminum, boron, gallium and indium, as well as ternary and quaternary mixtures thereof. These compounds, in general, are grown as crystalline films on a semiconductor substrate by either vapor phase or liquid phase epitaxial techniques.

In vapor phase epitaxy, a number of specific processes have been suggested for effecting the deposition of a III-V compound film. These processes usually include the steps of reacting two gaseous mixtures within an enclosed reaction chamber to provide a III-V compound. The two gaseous mixtures generally utilized in vapor phase epitaxy comprise as one of them, a first gaseous mixture formed by contacting a Group III element with hydrogen halide; while the other, or second gaseous mixture, is formed by mixing hydrogen, as a carrier gas, with a Group V element in gaseous form. The III-V compound resulting from the interreaction of the two gaseous mixtures is then deposited as an epitaxial film onto a suitable semiconductor substrate. The semiconductor substrate may be similar or different than the material used to form the epitaxial films and includes III-V compounds, II-VI compounds, as well as silicon and germanium.

One of the better known methods for producing III-V compounds is referred to as the vapor phase epitaxial hydride technique (VPE-Hydride). The specific details of this technique are set forth in a review paper by G. H. Olsen and T. J. Zamerowski, "Crystal Growth and Properties of Binary, Ternary and Quaternary (In, Ga) (As,P) Alloys grown by the Hydride Vapor Phase Epitaxy Technique", B. R. Pamplin (ed): Progress in Crystal Growth and Characterization, Vol II, Pergamon Press Ltd., London (1979), pp 309-375.

Unfortunately, the growth of III-V compounds, especially in the preparation of InP and the quaternary alloys (In,Ga)(As,P), is difficult and the resulting crystalline films lack good morphological characteristics and often possess a high number of impurities. The defects produced during the growth of epitaxial films originate from a number of sources, e.g., dislocation on the substrate, inappropriate epitaxial growth conditions, and the presence of foreign matter or impurities during the growth process. Since these particular compounds are of great importance in the fabrication of double heterostructure lasers and light-emitting diodes, a considerable research effort is currently being devoted to the specific preparation of InP and InGaAsP quaternary compounds which possess good morphological characteristics.

As a result of this research effort, it was found that the application of a continuous, in-situ, hydrogen chloride etch during the actual growth of the epitaxial layer promoted the formation of an epitaxial crystalline film with considerably fewer defects than that achieved heretofore by prior art methods. The hydrogen chloride etching material is added to the mixing zone of a conventional quartz reaction tube in addition to the hydrogen chloride which is conventionally added to the source zone of a typical three zone reactor, such as that used in the VPE hydride technique. The hydrogen chloride etch added to the mixing zone then flows into the deposition zone and provides the opportunity to remove impurities and unstable species that give rise to defect laden epitaxial films. The role of the HCl etch in the mixing zone, as well as in the deposition zone, appears to be the factor responsible for the lower carrier concentrations and higher mobilities obtained with the epitaxial InP layers grown by this modified VPE-hydride method.

In carrying out the method of this invention, the growth rates and morphological character of the epitaxial layers were studied as functions of temperature, amount of hydrogen chloride in the mixing zone, and flow rates of phosphine and source HCl (this being the HCl in the source zone which reacts with the elemental indium source to form InCl). Epitaxial layers with good morphology were observed when hydrogen chloride was added to the mixing zone at relatively low flow rates.

Heretofore, the in situ, non-continuous etching of substrates has been studied extensively in the preparation of GaAs and InP by the VPE-hydride technique. This preliminary non-continuous etching ensured a clean and damage-free substrate prior to epitaxial growth. The source HCl used in the the non-continuous etching processes was generated from the reaction of a group V trichloride with hydrogen. Unfortunately, however, the epitaxial layers produced heretofore were not sufficiently free from defects to the degree necessary to insure their use in heterojunction laser and light emitting diode applications.

Accordingly, the primary object of this invention is to provide a novel method for forming Group III-V epitaxial films that are relatively free from defects and possess good morphological characteristics.

Another object of this invention is to provide a novel method for forming Group III-V epitaxial layers on suitable semiconductor substrates.

Still another object of this invention is to provide a novel method for depositing a Group III-V epitaxial film by vapor phase epitaxy in which a continuous hydrogen chloride etch is maintained during the actual deposition and formation of the epitaxial film.

The above and still other objects and advantages of the present invention will become more readily apparent upon consideration of the following detailed description thereof when taken in conjunction with the following drawing.

DESCRIPTION OF THE DRAWING

In the drawing:

The FIGURE represents a schematic illustration of a conventional quartz reactor suitable for use in method of this invention.

DESCRIPTION OF THE PREFERRED EMBODIMENT

Pursuant to the above-defined objects, the present invention provides a novel method for depositing Group III-V compounds on suitable semiconductor substrates by the vapor phase epitaxy technique. It includes the novel concept of adding hydrogen chloride directly to an epitaxial reactor while the III-V epitaxial layers are being formed. The hydrogen chloride is introduced into the mixing and deposition zone of a conventional vapor phase reactor by adding it directly to the reactor or, alternatively, by adding it to one of the gaseous reactant mixtures, such as phosphine, which then in turn is introduced into the reactor in accordance with conventional vapor phase epitaxial growth techniques.

In general, the epitaxial layers of the III-V compounds of this invention are grown by vapor phase epitaxy by interacting two gaseous mixtures within a heated reaction chamber. The first gaseous mixture is formed by passing a mixed stream of a hydrogen carrier gas and hydrogen chloride over a Group III element, such as indium, which is positioned within the first or source zone of a three zone reactor. The Group III element is heated to a temperature sufficient to effect a reaction between it and the hydrogen-hydrogen chloride gaseous mixture. The reaction product is then directed into a second or mixing zone of the three zone reactor. At the same time, the second gaseous mixture, composed of hydrogen chloride, a hydrogen carrier gas, and a Group V element such as phosphine, is introduced into the mixing zone of the reactor and interreacts with the first gaseous mixture at a temperature sufficient to effect the deposition of Group III-V compound, as an epitaxial film, onto the surface of a suitable semiconductor substrate. The substrate is positioned within the third or deposition zone of the three zone reactor.

The epitaxial films formed by the method of this invention are relatively free from defects and possess good morphological characteristics. This provides the films with the properties necessary to insure their utilization in a variety of electronic applications, such as tunnel diodes and light emitting diodes, heterojunction lasers, solar-cells, radiation detectors, photodetectors and filters, as well as other semiconductor devices. The III-V compounds include the phosphides, antimonides, nitrides and arsenides of indium, gallium, aluminum and boron such as AlP, AlAs, AlSb, GaP, GaAs, GaSb, InP, InAs and InSb. The invention also contemplates the formation of ternary and quaternary compositions as well as mixed binary crystalline films. Specific examples of such mixtures are the combinations having the formula $GaAs_xP_{1-x}$, $InAs_xP_{1-x}$, $Ga_yIn_{1-y}As_xP_{1-x}$ wherein x and y represent integers having a value of less than one but greater than zero.

Materials useful as substrates for the epitaxial films may include the same or a different compounds than those used in preparing the epitaxial film and include III-V compounds, I-VII compounds, II-VI compounds and the elements silicon and germanium. Also, the materials used to form either the film or the substrate may contain suitable amounts of conventional doping agents which make them especially useful for devices using "surface junctions". The addition of a suitable dopant or impurity permits the creation of n-p or p-n junctions on the surface of a semiconductor of different conductivity. The doping material may be introduced in accordance with any conventional technique, e.g., dispersion within the reactive gaseous mixtures. The invention also contemplates the fabrication of plural epitaxial layers which may be similar or different in composition from preceeding layers.

In order to illustrate how the present invention is carried into effect, reference is made to the drawing which discloses a typical three-zone vapor phase growth apparatus suitable for use with this invention. The apparatus comprises an elongated quartz tube 10 divided into three temperature zones: a source zone 12, a mixing zone 14 and a deposition zone 16. These zones are heated to their desired or predetermined temperature by means of a conventional "clam shell" resistance heater, not shown. A semiconductor substrate 18 of suitable composition is placed in a substrate holder 22 and then the substrate and holder are introduced into the forechamber located adjacent gas inlet 24 of the reactor 10. The substrate is then flushed with an inert gas, e.g., hydrogen or nitrogen. The inert gas enters through gas inlet 24 and exits through a port not shown. After flushing, the substrate and holder are introduced into the reactor 10 through entry port 20 and positioned within the deposition zone 16 maintained at a predetermined temperature, usually about 650° C.

A first gaseous mixture containing hydrogen chloride and a hydrogen carrier gas is then introduced into the source zone 12 by means of gas inlet 26. The source zone 12 is usually maintained at a temperature of about 900° C. in order to effect a reaction between the gaseous mixture and a Group III source 28, such as the element indium or gallium. Source 28 is positioned in a quartz boat or container 30 which, in turn, is located within the source zone 12. The resulting vaporized reaction product, such as indium chloride, then flows into the mixing zone 14 where it inter-reacts with a gaseous mixture containing a group V element in gaseous form, such as arsine or phosphine, and a hydrogen carrier gas. In accordance with the improved method of this invention, hydrogen chloride is added to the Group V gaseous mixture and the resulting admixture is then introduced directly into the mixing zone 14, through gas inlet 32. The mixing zone is usually maintained at a temperature of about 950° C. The Group V mixture then mixes with the vaporous reaction product previously produced in the source zone and then flows into the deposition zone and deposits on the substrate as an epitaxial film. The temperatures utilized in the three zones may be varied over rather wide ranges, if desired. For example, deposition temperature may vary from about 650° to 1000° C.

Gas flow rates for the gaseous reactants are controlled and regulated by Tylan mass flow controllers not shown. The flow rate of the hydrogen chloride in the mixing zone may range from about 0.1 to 1.5 cc/minute. This HCl is the gas introduced through ga inlet 32 in mixture with the Group V element and the hydrogen carrier gas. The flow rate of the Group V elemental gas may vary from 2.3 to 15.9 cc/minute. The carrier hydrogen gas flow rate can vary from 1684 to 2790 cc/minute. The flow rate of the source HCl introduced through inlet 26 is about 4.0 to 6.0 cc/minute. Generally, an epitaxial film of sufficient growth can be prepared in about 45 minutes with the precise time duration for epitaxial growth being determined from the surface area of the substrate, mass of the deposit, and density of the resulting group III–V compound film.

In general, suitable semiconductor substrates can be obtained from Liquid Encapsulated Czochralski (LEC) grown crystalline boules. Slices of the boule are cut off to expose the crystallographic plane of the sliced boule for deposition of the III–V compound over the surface of the slice. The crystallographic plane may have any of the crystallographic faces exposed e.g. (100), (110), (111), etc. The slices are then polished, degreased and etched in accordance with conventional techniques and then blow-dried with nitrogen. The examples which follow are presented herein in order to provide a full and more detailed understanding of the present invention.

EXAMPLE 1

This example illustrates the formation and deposition of an epitaxial film of n-type InP on a semi-insulating InP substrate. The substrate was obtained from a Liquid Encapsulated Czochralski (LEC) grown iron-doped InP boule. A slice of the boule was cut 3° off the (100) plane towards the (111) plane. The slice was polished on an Electric polisher (Sylvania Co.) with Pellum PAN-W pads (J. T. Morris Co., Southbridge, Mass) using a 0.5–1.0% bromine-isopropyl alcohol solution. The substrates were degreased by treatment with toluene, 1,1,1-trichloroethane, and acetone. The substrates were etched for 5 minutes in Caro's acid (1 water + 1 $H_2O_2$ + 5 $H_2SO_4$). After washing with water the substrates were further etched for 2 minutes in a 0.3% $Br_2$-methanol solution and washed with methanol. This was followed by another 5 minute Caro's acid etch. The substrates were washed with water and then with methanol. The substrates were blow-dried with nitrogen.

The InP slice, weighing about 105.8 mg, and designated for convenience as 18 in the drawing, was placed on a quartz substrate holder 22 and inserted through entry zone 20 into quartz reaction tube 10. The reactor 10 is surrounded by heating elements not shown which maintain the source zone 12 at a temperature of 900° C., the mixing zone 14 at 950° C. and the deposition zone 16 at 650° C. Two sources of hydrogen chloride were directed into the reaction tube 10. The first stream of hydrogen chloride, referred to as the source HCl and having a flow rate of 5.3 cc/min., was directed through gas inlet 26 over a quartz boat 30 containing elemental indium 28. The indium was positioned within that portion of the reactor tube 10 referred to as the source zone 12. The second stream of hydrogen chloride, at a flow rate of 0.5 cc/min, was added directly to the mixing zone 14 by means of gas inlet 32 where it was first mixed with phosphine gas and a hydrogen carrier gas. This mixture was then introduced into the mixing zone 14. Alternatively, the second stream of HCl can be introduced directly into the mixing zone 14 by means of a separate gas inlet, not shown, rather than being introduced with the phosphine. The flow rate of the phosphine being introduced through gas inlet 32 was 15.9 cc/min. The hydrogen chloride introduced through inlet 26 into the source zone 12 reacts with the elemental indium 28 to form indium chloride (InCl) which is then transported from the source zone 12 into the mixing zone 14 by means of the hydrogen carrier gas which is likewise introduced by way of inlet 26. A hydrogen carrier gas is also introduced along with the phosphine/hydrogen chloride mixture added by means of inlet 32. The total carrier gas flow rate is 1680 cc/min, equally divided between the two inlets 26 and 32.

The InCl and phosphine mixture are admixed in the mixing zone 14 and intereact therein, as well as in the deposition zone 16, to produce a high quality, epitaxial film deposit on the InP substrate 18. The HCl added directly to the mixing zone 14, or, alternatively, added to the phosphine gas flow through inlet 32, removes any impurities or defects on the substrate 18 or the epitaxial film deposited thereon. This unique procedure gives rise to a high quality, epitaxial layered InP.

The system is run for about 45 minutes. This produces an epitaxial layer having a thickness of about 36.5 μm. The growth rate is determined from the surface area of the substrate, mass of deposit, and density of InP. The growth rate period may vary depending on the precise factors involved during determination of a desired growth rate.

Electrical measurements of the InP epitaxial layer prepared in Example 1, above, gave a mobility of 24,325 $cm^2$/v-sec and a carrier concentration of $1.42 \times 10^{15} cm^{-3}$. Carrier concentrations and mobilities were obtained from resistivity and Hall measurements at 77K by the van der Pauw technique. A permanent magnet provided a field of 4.0 kilogauss for the Hall measurements.

EXAMPLE 2

This example illustrates the formation and deposition of another epitaxial film of n-type InP on a semi-insulating InP substrate using conditions different than those described above in Example 1.

A rectangular polished substrate crystal of iron-doped InP weighing 112.6 mg was placed in the substrate holder 22 of the Quartz Reactor 10. As stated heretofore, the reactor 10 has three heating zones; source, mixing and deposition. In this example, the temperatures for the source zone, mixing zone and deposition zone were 900° C., 950° C. and 650° C., respectively. The source 28 was indium metal in a quartz boat 30. The indium 28 was converted into gaseous InCl by flowing 5.3 cc/min of hydrogen chloride over the elemental indium 28. This source hydrogen chloride was mixed with 840 cc/min of a hydrogen carrier gas at the inlet tube 26. Phosphine, with a hydrogen carrier gas, was added to the mixing zone 14 by means of gas inlet tube 32. The phosphine flow rate was 3.1 cc/min and the flow rate of the carrier hydrogen gas was 840 cc/min in each of inlet tubes 26 and 32. The total hydrogen carrier gas flow rate was 1680 cc/min. A second stream of hydrogen chloride was added directly to the mixing zone to improve the quality of the InP epitaxial layer. The flow rate of the second stream of hydrogen chloride introduced directly to the mixing zone was 1.5 cc/min. This HCl can either be added to the phosphine gas inlet 32, or directly to the mixing zone via another inlet tube, not shown. The InCl and phosphine species react at the substrate surface in the deposition zone 16 to form an epitaxial layer of InP. The HCl added directly to the mixing zone, or in conjunction with the phosphine gas flow through inlet 32, removes any impurities or defects on the substrate and the forming epitaxial layer. This unique method gives a high quality epitaxial layer of InP with excellent electrical characteristics.

The system is run for 45 minutes which produces a 10.7 μm thick epitaxial layer. The mobility and Carrier concentrations of the InP layers were found to be 27,340 cm$^2$/V$^{-1}$SEC$^{-1}$ and $1.4 \times 10^{15}$cm$^{-3}$ respectively. These test results were determined in the same manner as the test results obtained in Example 1.

EXAMPLE 3

A rectangular shaped, iron doped, indium phosphide substrate, weighing 106.6 mg was placed on the substrate holder 22 and introduced into the reactor 10. The same deposition procedure as outlined previously in Examples 1 and 2 above was repeated. The temperatures of the source mixing and deposition zones were maintained at 900° C., 950° C. and 650° C. respectively. The source hydrogen chloride reactant was introduced through inlet 26 at a flow rate of 5.3 cc/min and allowed to flow over an elemental indium source 28. Phosphine was introduced through inlet 32 at a flow rate of 3.1 cc/min and an additional flow of hydrogen chloride was introduced into the mixing zone at the rate of 1.3 cc/min. The deposition reaction was allowed to proceed for 45 minutes and resulted in the formation of an 18.6 μm epitaxial layer of indium phosphide on the substrate. An exhaust port 34 is provided to remove any excess reactants. The electrical characteristics of the epitaxial layer of InP was determined in the same manner as in Example 1 and found to have an area mobility of 24,055 cm$^2$/v$^{-1}$sec$^{-1}$ and a carrier concentration of $9.6 \times 10^{14}$Cm$^{-3}$. These measurements were carried out at a temperature of 77K.

The electrical properties of three InP samples prepared in accordance with the method of this invention are presented in Table I. These, results were calculated from the resistivity and Hall measurements obtained with the van der Pauw technique. According to calculations, the data shows that the compensation ratios at 77K for the three samples, EQ-8, EQ-14 and EQ-52, are 0.5, 0.7 and 0.5 respectively.

The present invention shows that the use of a continuous HCl etch improves the electrical properties of epitaxial grown Group III-V films prepared by the (VPE)-hydride technique, especially indium phosphide films grown on semiconductor substrates. The method clearly illustrates that epitaxial layers of Group III-V compounds of good morphological characters can be prepared with lower carrier concentrations and higher mobilities than were achieved heretofore.

TABLE I
ELECTRICAL P[ROPERTIES OF VPE-InP WITH GOOD MORPHOLOGY

| Run No. | Source HCl (sccm) | PH3 (sccm) | HCl in PH3 (sccm) | n (77K) cm | (77K) cm$^2$ V$^{-1}$sec$^{-1}$ |
|---|---|---|---|---|---|
| EQ-8  | 5.3 | 3.1  | 1.5 | $1.4 \times 10^{15}$ | 27,340 |
| EQ-14 | 5.3 | 3.1  | 1.3 | $9.6 \times 10^{14}$ | 24,055 |
| EQ-52 | 5.3 | 15.9 | 0.8 | $2.6 \times 10^{15}$ | 19,512 |

The epitaxial layers of the III-V compounds are the basic structures for the fabrication of many new and useful electronic devices. Among these devices that utilize epitaxial layered structures are lasers, light-emittive diodes, photodetectors, solar cells, optoelectronic switches, field-effect transistors, gunn-effect diodes, varactors, and IMPATTS. The lasers and photodetectors are suitable for use in applications such as audio disk playbacks and laser printers.

While the principles of this invention have been described with particularity, it should be understood by those skilled in the art that various alterations and modifications can be made without departing from the spirit of the invention, and that all such modifications as are included within the scope of the appended claims are intended to be included herein.

We claim:

1. A method for preparing and depositing an epitaxial film consisting essentially of indium phosphide onto the surface of a suitable substrate crystallographically compatible with said film, said method consisting essentially of the steps of:
    (A) positioning a substrate suitable for epitaxial growth of indium phosphide on the surface thereof in a first deposition zone located at one end of a quartz reaction chamber while maintaining said first deposition zone at a predetermined temperature;
    (B) positioning a source material consisting essentially of indium in a second source zone located at the other end of said quartz chamber while maintaining said second source zone at a predetermined temperature;
    (C) introducing a gaseous mixture consisting essentially of (a) a first hydrogen chloride gas and (b) a hydrogen carrier gas into said second source zone and passing said gaseous mixture over said indium source to produce a first gaseous reactant consisting essentially of indium chloride;
    (D) introducing said first gaseous indium chloride reactant into a third mixing zone of said quartz chamber, said third mixing zone being maintained at a predetermined temperature and positioned intermediate said first deposition and said second source zones;
    (E) introducing a second gaseous reactant into said third mixing zone simultaneously with the entry of said first gaseous reactant into said third mixing zone, said second gaseous reactant comprising a mixture of (a) phosphine and (b) a hydrogen carrier gas to form a gaseous mixture consisting essentially of indium chloride, phosphine and hydrogen;

(F) continously introducing a flow of a second hydrogen chloride gas into said third mixing zone to form a gaseous admixture consisting essentially of (a) said second hydrogen cloride gas and (b) said gaseous mixture of indium chloride, phosphine and hydrogen and subsequently introducing said formed gaseous admixture into said heated first deposition zone to contact said substrate and affect the deposition of an indium phosphide, epitaxial, crystalline film thereon.

2. A method in accordance with claim 1 wherein said second hydrogen halide gas is first combined with said second gaseous reactant.

3. A method in accordance with claim 1 wherein said second hydrogen halide gas is introduced directly into said heated third zone.

4. A method in accordance with claim 1 wherein said substrate consists essentially of an iron-doped indium phosphide compound and said first, second and third zones are maintained at temperatures of about 650° C., 900° C. and 950°, respectively.

5. A method in accordance with claim 1 wherein said phosphine is introduced at a flow rate of about 2.3 to 15.9 cc/minute; said first hydrogen chloride is introduced at a flow rate of about 5.3 cc/minute; said second hydrogen chloride is introduced at a flow rate of about 0.1 to 1.5 cc/minute and said inert gases are introduced at a total flow rate of about 1680 cc/minute.

* * * * *